United States Patent [19]
Mart

[11] 3,936,853
[45] Feb. 3, 1976

[54] DEVELOPER APPARATUS FOR LITHOGRAPHIC PLATE PROCESSING SYSTEM

[76] Inventor: Milam E. Mart, P.O. Box 29, Carrollton, Tex. 75006

[22] Filed: June 6, 1974

[21] Appl. No.: 476,918

[52] U.S. Cl. ............... 354/297; 118/111; 118/120; 354/317
[51] Int. Cl.² ........................................ G03D 13/00
[58] Field of Search .......... 354/297, 325, 326, 319, 354/317; 118/109, 111, 120

[56] References Cited
UNITED STATES PATENTS

| | | | |
|---|---|---|---|
| 1,171,627 | 2/1916 | Muller | 118/111 |
| 3,059,560 | 10/1962 | Gutzmer | 354/325 |
| 3,593,641 | 7/1971 | Adams et al. | 354/317 |
| 3,608,464 | 9/1971 | Harrell et al. | 354/319 X |
| 3,621,772 | 11/1971 | Bogue | 354/317 |
| 3,625,131 | 12/1971 | Puls | 354/325 X |
| 3,682,078 | 8/1972 | Parker et al. | 354/319 X |
| 3,682,079 | 8/1972 | Casson | 354/319 X |
| 3,719,133 | 3/1973 | Haracz | 354/317 |
| 3,752,054 | 8/1973 | Scanlan | 354/317 |
| 3,771,428 | 11/1973 | Horner et al. | 118/109 X |

Primary Examiner—Richard L. Moses
Attorney, Agent, or Firm—Richards, Harris and Medlock

[57] ABSTRACT

A lithographic plate processing system includes apparatus for applying developer to the exposed surface of a lithographic plate, apparatus for spreading the developer uniformly over the exposed surface, a developer apparatus, apparatus for washing excess developer from the plate, and apparatus for applying gum arabic to the exposed surface of the plate, and may include apparatus for drying the plate. The developer spreader apparatus comprises a plurality of rectangularly shaped developer members mounted on a subframe for rotation about axes extending perpendicular to the exposed surface of the lithographic plate and positioned to rotate in overlapping circles. The subframe also supports a common drive apparatus for simultaneously rotating all of the developer members. Structure is provided for concurrently oscillating the plate and the developer members supported thereby along a path extending transversely to the direction of movement of the lithographic plate, thereby assuring that the developer is distributed uniformly over the entire exposed surface of the plate. The developer members may comprise either sponges or brushes mounted for engagement with the exposed surface of the lithographic plate.

9 Claims, 3 Drawing Figures

DEVELOPER APPARATUS FOR LITHOGRAPHIC PLATE PROCESSING SYSTEM

BACKGROUND AND SUMMARY OF THE INVENTION

In the lithographic printing process, a lithographic plate comprising an aluminum sheet is initially coated with a photosensitive layer. A negative is applied over the photosensitive layer, after which the lithographic plate having the negative applied thereto is exposed to high intensity light. The negative is then removed, and the plate is fed into a lithographic plate processor.

In the processor, developer is initially applied to the exposed surface of the plate and is then spread across the entire exposed surface. A developer apparatus then distributes the developer on the exposed surface. Next, the exposed surface is washed to remove excess developer. A layer of gum arabic is then applied to the exposed surface, after which the lithographic plate may be dried.

Following the processing operation, the lithographic plate is ready for use in a conventional lithographic press to effect printing. In the press, ink is applied to the plate by means of a roller. The plate is then utilized to print on a blanket, which is in turn used to print a plurality of sheets formed from paper or other material in the conventional manner.

The present invention relates to an improved developer apparatus for lithographic plate processors, and more particularly to a developer apparatus which simulates the results obtained by means of manual developing techniques. It has heretofore been known to utilize in a lithographic plate processor a developer apparatus comprising a large sponge which is moved laterally as the lithographic plate passes thereunder. Such a device does not achieve satisfactorily uniform developing over the exposed surface of the plate, which in turn results in poor quality lithographic prints. Thus, a need exists for an improved developer apparatus for use in lithographic plate processors, and in particular for a developer apparatus capable of duplicating the results heretofore obtainable only by means of manual developing.

In accordance with the broader aspects of the invention, a developer apparatus for use in lithographic plate processors comprises a plurality of developer members positioned for engagement with the exposed surface of a lithographic plate. Structure is provided for rotating the developer members about spaced axes each extending substantially perpendicularly to the plane of the exposed surface of the plate. Simultaneously with such rotation, all of the developer members are oscillated relative to the path of movement of the lithographic plate, thereby developing the exposed surface of the plate in a substantially more uniform satisfactory manner than has been possible to achieve heretofore other than manually.

In accordance with more specific aspects of the invention, the developer members comprise rectangularly shaped members and are mounted for rotation about overlapping circles. In one embodiment of the invention the developer members comprise sponges formed from nylon or the like and mounted for engagement with the exposed surface of the lithographic plate. In accordance with another embodiment of the invention the developer members comprise brushes formed from nylon or the like and positioned for engagement with the exposed surface of the lithographic plate.

In accordance with still other aspects of the invention, the developer members are rotatably supported on a subframe. The subframe also supports a drive mechanism which functions to simultaneously rotate all of the developer spreader members. Structure is provided for oscillating the subframe in a direction extending substantially transversely to the direction of lithographic plate movement concurrently with the rotation of the developer members. By means of the simultaneous rotation and oscillation of the developer members, the present invention functions to develop the exposed surface of a lithographic plate in a highly uniform and superior manner.

DESCRIPTION OF THE DRAWINGS

A more complete understanding of the invention may be had by reference to the following detailed description when taken in conjunction with the accompanying drawings, wherein.

DETAILED DESCRIPTION

Figure 1:
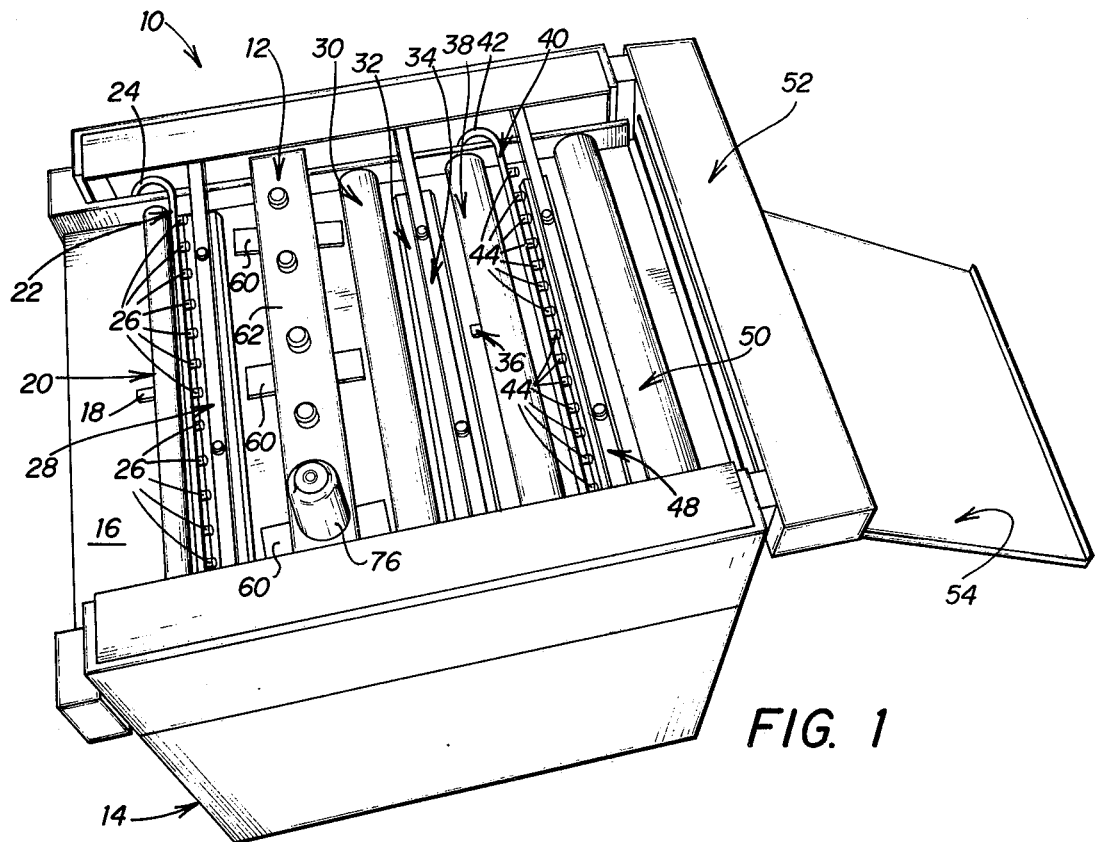
FIG. 1 is a perspective view of a photographic plate processor utilizing a developer apparatus incorporating the present invention.

Referring now to the drawings, and particularly to FIG. 1 thereof, there is shown a lithographic plate processor 10 utilizing a developer apparatus 12 incorporating the present invention. The processor 10 includes a frame 14 serving as a support for the various operating instrumentalities of the processor. The frame 14 also serves as a housing which encloses the various drive motors, pumps, and other devices which are utilized to effect operation of the processor. The frame 14 further also encloses control circuitry which functions to regulate the operation of the processor.

Exposed lithographic plates are received in the processor 10 on a support surface 16 of the frame 14 at the left-hand end thereof (FIG. 1). Upon entering the processor 10, the plate actuates a microswitch 18 which initiates the processing cycle. The plate then passes between a pair of drive rollers 20 which function to propel the lithographic plate along the initial portion of a predetermined path extending through the processor 10.

The plate then passes through a developer applying apparatus 22. The apparatus 22 receives developer from a reservoir thereof under the action of a variable speed pump. The pump supplies developer to the apparatus 22 through a conduit 24 and a plurality of discharge outlets 26. The apparatus 22 functions to apply the developer to the exposed surface of the lithographic plate in exactly the quantity required in order to completely cover the exposed surface of the plate without waste.

After passing through the developer applying apparatus 22, the lithographic plate passes under a first oscillating bar 28. The oscillating bar functions to spread the developer evenly over the entire exposed surface of the plate. The lithographic plate then passes through the developer apparatus 12 of the present invention. As will become more apparent hereinafter, the developer apparatus 12 functions in the manner of manual developing techniques to achieve a superior and uniform developing result.

The lithographic plate then moves between a pair of drive rollers 30 which function to propel the plate through the intermediate portion of the predetermined path through the processor 10. The plate then passes through a washing apparatus 32 which directs water onto the exposed surface of the lithographic plate to remove excess developer therefrom. The plate then passes under a second oscillating bar 34 which functions to scrub the plate to assure thorough cleaning thereof. The second oscillating bar 34 may comprise a sponge for scrubbing the exposed surface of the lithographic plate, and the washing apparatus 32 may comprise structure for directing water through the sponge of the second oscillating bar 34. Other washing and scrubbing apparatus may also be utilized in the processor 10, if desired.

The lithographic plate next engages a microswitch 36 which activates the gum arabic applying cycle of the lithographic plate processor 10. The plate passes between a pair of drive rollers 38 which propel the plate through the final portion of the predetermined path through the processor 10. The plate then passes beneath a gum arabic applying apparatus 40.

The gum arabic applying apparatus 40 receives gum arabic from a reservoir thereof under the action of a variable speed pump. Gum arabic from the pump passes through a conduit 42 having a plurality of discharge outlets 44. The apparatus 40 functions to apply gum arabic to the exposed surface of the lithographic plate in exactly the quantity required to cover the entire exposed surface of the plate without waste.

Having passed under the gum arabic applying apparatus 40, the lithographic plate passes beneath a third oscillating bar 48 which functions to spread the gum arabic uniformly over the entire exposed surface of the lithographic plate. The plate then passes through a pair of relatively large diameter squeegee rollers 50 which function to remove excess gum arabic.

Having passed through the squeegee rollers 50, the lithographic plate may be directed through a dryer 52, in which event the plate is delivered from the processor 10 in a ready-to-use condition. The dryer 52 is optional, and if it is used in conjunction with the processor 10, it is mounted on the frame 14 thereof. In any event the lithographic plate is received from the processor 10 on a receiving tray 54 from which it may be removed for use in conventional lithographic printing operations.

Figure 2:
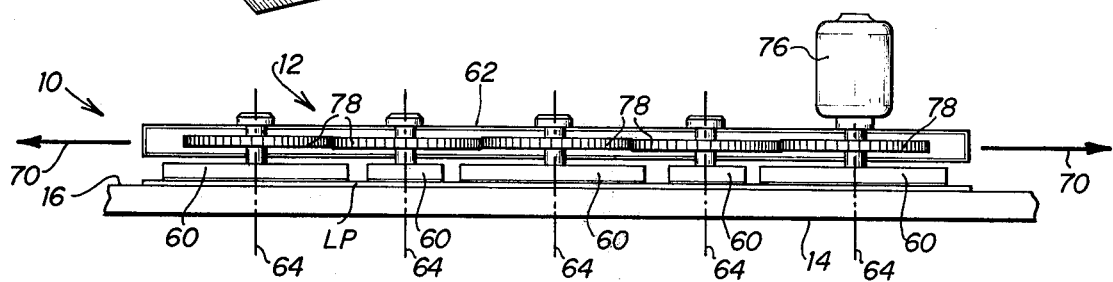
FIG. 2 is a side view of a developer apparatus incorporating the invention.
Figure 3:
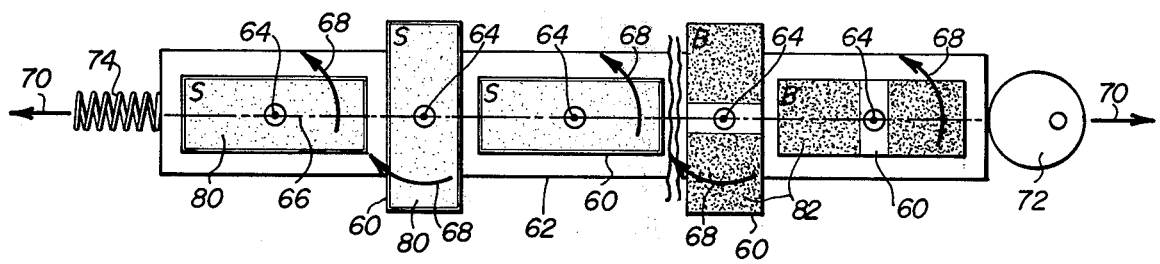
FIG. 3 is a bottom view of the developer apparatus of FIG. 2 and further illustrating a second embodiment of the invention.

The construction and operation of the developer apparatus 12 of the lithographic plate processor 10 will be better understood by reference to FIGS. 2 and 3. The developer apparatus 12 comprises a plurality of developer members 60 which are supported on a subframe 62 for rotation about spaced, parallel axes 64. The axes 64 extend substantially perpendicularly to the plane of the exposed surface of an exposed lithographic plate LP supported on the surface 16 of the frame 14 and passing through the processor 10 under the action of the drive rollers thereof.

Referring to FIG. 3, the axes of rotation 64 of the developer members 60 are located at spaced points along a line 66 extending substantially transversely to the direction of movement of a lithographic plate through the processor 10. The developer members 60 are preferably rectangularly shaped, and the positioning of the axes 64 relative to the dimensions of the developer members 60 is such that the developer members define overlapping circles during the rotation thereof. The developer members 60 rotate in the directions indicated by the arrows 68 in FIG. 3, with three of the developer members rotating counterclockwise and two of the developer members rotating clockwise (FIG. 3). It will of course be understood that the developer apparatus 12 may employ any convenient number of developer members 60 and is not restricted to any particular number.

In the operation of the developer 12, the developer members 60 are simultaneously rotated in the directions indicated by the arrows 68. Concurrently with such rotation, the developer members 60 are oscillated back and forth along the line 66 in the manner indicated by the arrows 70. Oscillation of the developer members 60 is effected by oscillating the subframe 62 which supports the developer members 60. For example, the subframe 62 may be oscillated by means of a rotating cam 72 and a spring 74 in the manner illustrated in FIG. 3. Other apparatus for oscillating the subframe 62 and the developer members 60 carried thereby will readily suggest itself to those skilled in the art.

Referring again to FIG. 3, the subframe 62 supports a drive motor 76 which functions to simultaneously rotate all of the developer members 60. The drive motor 76 is coupled directly to the right-hand (FIG. 2) developer members 60, and is operatively connected to the remaining developer members 60 by means of gears 78 contained within the subframe 62. Again, other apparatus for concurrently rotating the developer members 60 under the action of the drive motor 76 will readily suggest themselves to those skilled in the art.

FIG. 3 further illustrates two alternative embodiments of the invention. In accordance with one embodiment, the developer members 60 of the developer apparatus 12 may comprise sponges 80 formed from nylon or similar materials. In accordance with another embodiment of the invention, the developer members 60 comprise brushes 82 formed from nylon or similar materials. The choice of the materials utilized in fabricating the sponges 80 or the brushes 82 of the developer members 60 is not critical to the practice of the invention, so long as the material is sufficiently wear-resistant to permit long term usage of the developer members 60.

The developer apparatus 12 of the present invention has been found to provide more uniform and superior distribution and working of the developer that is applied to the exposed surface of a lithographic plate than is possible with prior developer apparatus. These superior results are due in large part to the fact that the developer apparatus 12 employs developer members which are simultaneously rotated and oscillated relative to the path of movement of the lithographic plate. This action simulates the motions which are utilized in the hand developing of a lithographic plate, whereby the developer apparatus 12 of the present invention achieves developing results more nearly comparable with those heretofore obtainable only by means of hand developing techniques.

From the foregoing, it will be understood that the present invention comprises substantial improvements in the art of developer apparatus for lithographic plate processors. Perhaps the most important advantage deriving from the use of the invention relates to the fact that by means thereof it is possible to achieve superior developing of a lithographic plate which simulates the results heretofore only obtainable manually. Another advantage in the use of the invention involves the fact that developer apparatus constructed in accordance therewith are comprised of a relatively small number of easily manufactured parts and are therefore economical to manufacture and use. Still another advantage to the use of the invention involves the fact that developer apparatus constructed in accordance therewith are adapted for long term, substantially maintenance-free usage.

Although particular embodiments of the invention have been illustrated in the accompanying drawings and described in the foregoing detailed description, it will be understood that the invention is not limited to the embodiments disclosed, but is capable of numerous rearrangements, modifications, and substitutions of parts and elements without departing from the spirit of the invention.

What is claimed is:

1. A lithographic plate processing system comprising:
   means for moving an exposed lithographic plate having at least a predetermined width along a predetermined path at a predetermined rate;
   means positioned on the path for applying developer to the exposed surface of the lithographic plate;
   means positioned on the path for uniformly developing the entire exposed surface of the plate;
   said developing means comprising:
      a plurality of rectangularly shaped developer spreading members positioned at spaced points along a line extending subtantially transversely to the direction of movement of the lithographic plate along the predetermined path, each said spreading member mounted for engagement with the exposed surface of the lithographic plate, the line of developer spreading members extending completely across the processor, and having a width at least equal to said predetermined width;
      means for rotating the developer spreading members about spaced apart axes each extending substantially perpendicularly to the plane of the exposed surface of the lithographic plate;
      each of said spreading members extending in both directions from its axis of rotation more than half the distance between adjacent axes so that the paths of rotation of adjacent developer spreading members overlap one another, thereby applying developer uniformly to the entire surface of the plate exposed to the line of said developer spreading members; and
      means for simultaneously oscillating all of the rotating developer spreading members along a line extending substantially transversely to the direction of movement of the lithographic plate;
   the rate of said oscillation being wholly independent of the rate of movement of the lithographic plate along said predetermined path;
   means positioned on the path of movement of the lithographic plate for washing the exposed surface of the plate to remove excess developer therefrom; and
   means positioned on the path of movement of the lithographic plate for applying gum arabic to the exposed surface thereof.

2. The lithographic plate processing system according to claim 1 wherein the developer spreading members are mounted about the spaced apart axes such that upon rotation said members describe overlapping circles.

3. The lithographic plate processing system according to claim 2 wherein the developer spreading members comprise sponges positioned for engagement with the exposed surface of the lithographic plate.

4. The lithographic plate processing system according to claim 2 wherein the developer spreading members comprise brushes positioned for engagement with the exposed surface of the lithographic plate.

5. For use in a lithographic plate processing system, a developer apparatus comprising:
   a plurality of rectangularly shaped developer spreading members mounted along a predetermined line and all positioned for engagement with the exposed surface of a lithographic plate traveling through the apparatus at a predetermined speed;
   said line of developer spreading members extending across the entire width of said apparatus;
   means for simultaneously rotating all of the developer spreading members around a plurality of axes positioned at spaced points along a predetermined line and each extending substantially perpendicularly to the plane of the exposed surface of the lithographic plate each of said developer spreading members extending in both directions from its axes of rotation more than half the distance between adjacent axes so that the paths of rotation of adjacent developer spreading members overlap one another, thereby extending in a continuous line predetermined to be longer than the width of the plate; and
   means for simultaneously oscillating all of the rotating developer spreading members along the predetermined line wherein the frequency of oscillation is independent of the speed at which the plate travels through the developer apparatus.

6. The developer apparatus according to claim 5 wherein the oscillating means functions to oscillate the developer spreading members in a direction extending transversely to the direction of movement of the lithographic plate.

7. The developer apparatus according to claim 5 wherein the developer spreading members comprise sponges mounted for engagement with the exposed surface of the lithographic plate.

8. The developer apparatus according to claim 5 wherein the developer spreading members comprise brushes mounted for engagement with the exposed surface of the lithographic plate.

9. The developer apparatus according to claim 5 further characterized by:
   a frame;
   means for rotatably supporting all of the developer spreading members on the frame;
   a common drive system mounted on the frame for simultaneously rotating all of the developer spreading members; and
   means for oscillating the frame along the predetermined line and thereby simultaneously oscillating all of the rotating developer spreading members.

* * * * *